(12) United States Patent
Nose (10) Patent No.: US 11,353,497 B2
(45) Date of Patent: Jun. 7, 2022

(54) TEST SOCKET

(71) Applicant: Yamaichi Electronics Co., Ltd., Tokyo (JP)

(72) Inventor: Takanori Nose, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 26 days.

(21) Appl. No.: 16/832,896

(22) Filed: Mar. 27, 2020

(65) Prior Publication Data
US 2021/0302490 A1 Sep. 30, 2021

(51) Int. Cl.
*G01R 31/28* (2006.01)
*G01R 1/04* (2006.01)

(52) U.S. Cl.
CPC ......... *G01R 31/2863* (2013.01); *G01R 1/045* (2013.01); *G01R 1/0466* (2013.01); *G01R 31/2886* (2013.01)

(58) Field of Classification Search
CPC .... G01R 1/2863; G01R 1/045; G01R 1/0466; G01R 31/2886
See application file for complete search history.

(56) References Cited

U.S. PATENT DOCUMENTS

| | | | |
|---|---|---|---|
| 2012/0149249 A1* | 6/2012 | Ihara | H01R 12/88 439/660 |
| 2012/0244648 A1* | 9/2012 | Matsuhashi | G01R 1/0466 438/15 |
| 2012/0315775 A1* | 12/2012 | Zhou | G01R 31/2863 439/68 |
| 2013/0192983 A1* | 8/2013 | Fujikata | C25D 17/001 204/242 |
| 2017/0148660 A1* | 5/2017 | Toyomura | H01L 21/68792 |

FOREIGN PATENT DOCUMENTS

JP 2014-517310 A 7/2014

* cited by examiner

*Primary Examiner* — Akm Zakaria
(74) *Attorney, Agent, or Firm* — Hamilton, Brook, Smith & Reynolds, P.C.

(57) ABSTRACT

A test socket includes a pedestal. The pedestal includes a central pedestal including a central contact portion coming in contact with a central region of a bottom surface of a semiconductor package and a plurality of insertion holes formed to correspond to a plurality of solder balls projecting from the bottom surface of the semiconductor package, so as to allow the solder balls to be inserted into respective insertion holes. The pedestal further includes a circumferential pedestal separated from the central pedestal by a space having an opening width larger than a diameter of the insertion hole and including a circumferential contact portion coming in contact with a circumference of the bottom surface of the semiconductor package.

7 Claims, 9 Drawing Sheets

TEST SOCKET

TECHNICAL FIELD

The present invention relates to a test socket for testing a semiconductor package such as an IC package.

BACKGROUND ART

A semiconductor package such as an IC package to be mounted in an electronic device is usually tested by using a test socket before the package is mounted on a circuit board so as to eliminate a latent defect. Such a test socket includes, for example, a pedestal as disclosed in Patent Literature 1 (PTL 1) on which a bottom surface of the semiconductor package having a ball grid array (BGA) structure is seated, the pedestal being provided in an opening where the semiconductor package is accommodated. The pedestal includes a large number of insertion holes for respective solder balls projecting from the bottom surface of the semiconductor package. The insertion holes correspond one-to-one to solder balls, and the insertion holes are used as guides for respective solder balls.

CITATION LIST

Patent Literature

{PTL 1}
Japanese Unexamined Patent Application Publication (Translation of PCT Application) No. JP 2014-517310

SUMMARY OF INVENTION

Technical Problem

In association with downsizing of the semiconductor package, terminals (solder balls) of the semiconductor package are miniaturized (with narrower pitches and more multiple contacts), which is likely to cause positional displacement of the terminals onto respective insertion holes formed in the pedestal and improper seating of the package.

To solve the above problem, it is an object of the present invention to provide a test socket capable of properly positioning terminals of a semiconductor package onto respective insertion holes formed in a pedestal.

Solution to Problem

A test socket according to one aspect of the present invention includes a pedestal on which a bottom surface of a semiconductor package to be tested is mounted during testing. The pedestal includes a central pedestal including a central contact portion coming in contact with a central region of the bottom surface of the semiconductor package and a plurality of insertion holes formed to correspond to a plurality of projection terminals projecting from the bottom surface of the semiconductor package, so as to allow the projection terminals to be inserted into respective insertion holes. The pedestal further includes a circumferential pedestal separated from the central pedestal by a space having an opening width larger than a diameter of the insertion hole and including a circumferential contact portion coming in contact with a circumference of the bottom surface of the semiconductor package.

The semiconductor package to be tested is set on the pedestal of the test socket to undergo testing. During testing, the bottom surface of the semiconductor package is set on the pedestal of the test socket. At this time, the plurality of projection terminals arranged on the bottom surface of the semiconductor package are properly inserted into respective insertion holes formed in the pedestal. In other words, the insertion holes properly correspond one-to-one to respective projection terminals.

However, when the semiconductor package is mounted on the pedestal, one side of the bottom surface of the semiconductor package may earlier come in partial contact with the pedestal due to some failure. If the bottom surface of the semiconductor package partially comes in contact with the pedestal, projection terminals arranged in a vicinity of a partially contact region may be inserted into insertion holes different from properly corresponding insertion holes, resulting in a test failure.

To address such a problem, the circumferential pedestal is provided to be separated by the space from the central pedestal. Even when the bottom surface of the semiconductor package partially comes in contact with the pedestal, the projection terminals arranged in the vicinity of the partially contact region are guided to the space provided between the central pedestal and the circumferential pedestal. The space has the opening width larger than the diameter of the insertion hole. Therefore, differently from the insertion holes, the space does not guide the projection terminals to improper positions to determine positioning.

Even if one side of the semiconductor package might fall in the space provided between the central pedestal and the circumferential pedestal, the circumferential pedestal includes the circumferential contact portion coming in contact with the circumference of the bottom surface of the semiconductor package, thereby preventing one side of the semiconductor package from falling in the space.

Since the circumferential contact portion is provided to come in contact with the circumference of the bottom surface of the semiconductor package, the bottom surface of the semiconductor package can be held stably.

Thus, the projection terminals of the semiconductor package can be properly positioned onto respective insertion holes formed in the pedestal.

Note that projection terminals provided on the bottom surface of the semiconductor package are, for example, solder balls if the semiconductor package has a ball grid array (BGA) structure.

The opening width of the space is, for example, a width of two or more adjacent insertion holes, preferably a width of three or more adjacent insertion holes.

In the test socket according to one aspect of the present invention, the circumferential contact portion is provided at a position corresponding to a whole of the circumference of the bottom surface of the semiconductor package.

Since the circumferential contact portion is provided over the whole of the circumference of the bottom surface of the semiconductor package, the bottom surface of the semiconductor package can be held more stably.

In the test socket according to one aspect of the present invention, the circumferential contact portion has a width dimension so as to come in contact with a further circumferential side of the bottom surface of the semiconductor package than the projection terminal arranged closest to the circumferential side of the semiconductor package.

The circumferential contact portion holds the further circumferential side of the bottom surface of the semiconductor package than a region where projection portions are arranged. This can avoid the projection portions from interfering with the circumferential contact portion.

Note that the width dimension of the circumferential contact portion means a dimension in a direction from the circumferential pedestal toward the central pedestal.

In the test socket according to one aspect of the present invention, a position in height of the circumferential contact portion is equal to or lower than a position in height of the central contact portion.

By setting the position in height of the circumferential contact portion to be equal to the position in height of the central contact portion, the bottom surface of the semiconductor package can be held stably by the circumferential contact portion and the central contact portion.

The position in height of the circumferential contact portion may be lower than the position in height of the central contact portion, since the bottom surface of the semiconductor package can be held stably only by the central contact portion. However, the position in height of the circumferential contact portion is preferably to be 50% or more of the height dimension of the central contact portion (50% or more of a depth dimension of the insertion holes).

Note that the position in height means a position in an insertion direction of the semiconductor package.

The test socket according to one aspect of the present invention further includes a first pressing piece positioned on one end side of the pedestal and abutting on a top surface of the semiconductor package to press the semiconductor package against the pedestal, and a second pressing piece positioned on another end side of the pedestal facing the one end side of the pedestal and abutting on the top surface of the semiconductor package to press the semiconductor package against the pedestal.

The first pressing piece and the second pressing piece can reliably press and fix the semiconductor package to the pedestal, thereby preventing positional displacement caused by, for example, a vibration during testing.

The circumferential pedestal includes the circumferential contact portion. Therefore, even when one side of the bottom surface of the semiconductor package is set on the circumferential pedestal earlier than the other side of the semiconductor package due to a slight pressing time difference between two pressing pieces, it is possible to avoid bounce movement of the other side of the semiconductor package when the pressing pieces press the semiconductor package.

In the test socket according to one aspect of the present invention, the circumferential contact portion is provided only at positions corresponding to the first pressing piece and the second pressing piece.

The semiconductor package may be caught at the circumferential contact portion, so that the semiconductor package can be improperly seated. Accordingly, positions of the circumferential contact portion are limited to the positions corresponding to the first pressing piece and the second pressing piece. This can prevent improper seating of the semiconductor package as much as possible.

In the test socket according to one aspect of the present invention, the circumferential pedestal includes a tapered surface inclined downward from the circumferential contact portion so as to be closer to the central pedestal.

Since the tapered surface inclined downward from the circumferential contact portion so as to be closer to the central pedestal, a dimension of the circumferential contact portion projecting toward the space can be made smaller. This can prevent the semiconductor package from being caught at the circumferential contact portion as much as possible.

Advantageous Effects of Invention

The projection terminals of the semiconductor package can be properly positioned onto respective insertion holes formed in the pedestal.

The bounce movement of the semiconductor package, which may be caused by a slight pressing time difference between two pressing pieces, can be reliably prevented.

DESCRIPTION OF EMBODIMENTS

With reference to the drawings, embodiments according to the present invention are described below.

First Embodiment

Figures 1, 2:
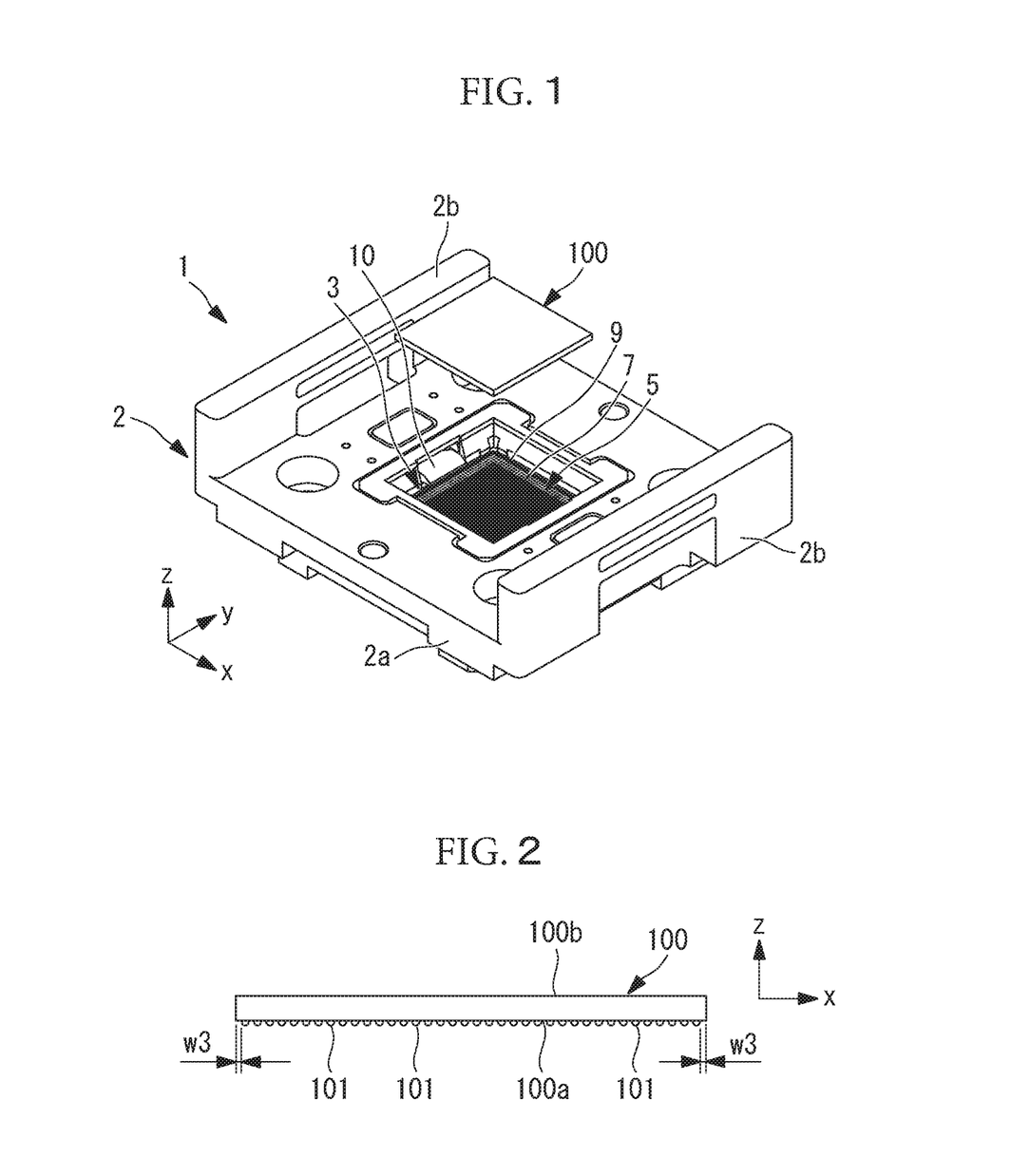
FIG. 1 is a perspective view illustrating a test socket according to a first embodiment of the present invention.
FIG. 2 is a lateral view illustrating a semiconductor package.

FIG. 1 shows a test socket 1 (hereinafter simply referred to as "socket 1") according to a first embodiment. The socket 1 is placed on, for example, a printed circuit board used as a test board. The socket 1 includes a body 2 having a substantially rectangular parallelepiped outer shape. The body 2 includes a plate portion 2a extending along an xy plane shown in FIG. 1, and wall portions 2b standing upward from both sides of the plate portion 2a in an x direction thereof (standing from the both sides in an upper direction of a Z direction).

Note that, in the following, the x direction is defined as a direction in which the plate portion 2a of the body 2 extends and the wall portions 2b are provided, a y direction is defined as a direction which is perpendicular to the x direction, and the z direction is defined as a direction which is perpendicular to the xy plane and is a plate thickness direction of the plate portion 2a.

In a center of the plate portion 2a of the body 2, a recess 3 is formed, the recess 3 having a depth in the z direction. The recess 3 has a rectangle shape in a planar view. A semiconductor package 100 to be tested is inserted into and set on the recess 3.

The semiconductor package 100 used in the present embodiment is a package having a ball grid array (BGA) structure. As shown in FIG. 2, the semiconductor package 100 has a rectangular shape in a planar view, the size of which is, for example, approximately 10 mm to 5 mm square. The semiconductor package 100 includes a plurality of solder balls (projection terminals) 101 provided on a bottom surface 100a thereof, each having a substantially semi-spherical shape. The solder balls 101 project from the bottom surface 100a in the z direction and each have a substantially semi-spherical shape. When the semiconductor package 100 is viewed from the bottom, the solder balls 101 are two-dimensionally arranged at a predetermined pitch in x and y directions (in longitudinal and lateral directions). The solder balls 101 adjacent to one another in the x or y direction have a pitch of, for example, approximately 0.4 mm. The semiconductor package 100 may be any semiconductor package having a structure in which a plurality of projection terminals projecting from a bottom surface are provided.

As shown in FIG. 1, below the recess 3, a pedestal 5 is provided. The pedestal 5 includes a central pedestal 7 provided in a center of the recess 3 and a circumferential pedestal 9 provided to be separated by a space S1 (see FIG. 3) from the central pedestal 7.

Figure 3:
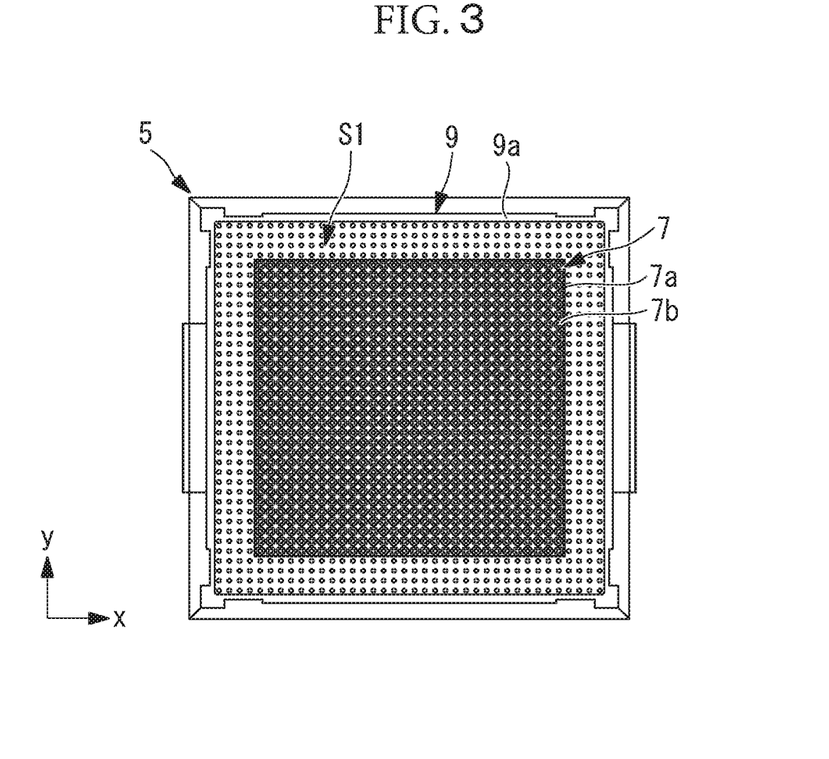
FIG. 3 is a plan view illustrating a pedestal.

FIG. 3 shows the pedestal 5 in a planar view. The central pedestal 7 provided in a center of the pedestal 5 on the xy plane has a substantially square shape. However, the central pedestal 7 may have a rectangular shape or another shape such as a circular shape or an oval shape. An upper end surface of the central pedestal 7 in the z direction upward is defined as a central contact portion 7a coming in contact with the bottom surface 100a (see FIG. 2) of the semiconductor package 100. The central pedestal 7 includes a plurality of insertion holes 7b formed downward from the central contact portion 7a. The plurality of insertion holes 7b are each have a cylindrical shape having a center axis in a longitudinal direction (in the z direction). The insertion holes 7b have diameters slightly larger than the diameters of solder balls 101 (see FIG. 2). Thus, the insertion holes 7b are used as guides of the solder balls 101. The insertion holes 7b correspond one-to-one to proper solder balls 101.

The circumferential pedestal 9 is provided so as to surround the central pedestal 7. Specifically, the circumferential pedestal 9 is in a rectangle frame shape having four sides extending in x and y directions so as to correspond to sides of the central pedestal 7. An upper end surface of the circumferential pedestal 9 in the z direction upward is defined as a circumferential contact portion 9a coming in contact with a circumference of the bottom surface 100a of the semiconductor package 100.

Figure 4:
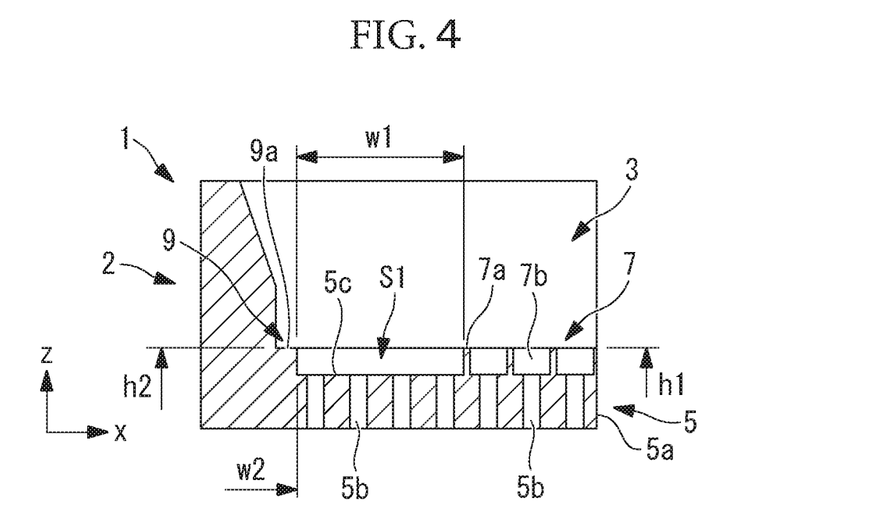
FIG. 4 is a partially enlarged longitudinal sectional view illustrating the pedestal.

As shown in FIG. 4, a position in height h1 of the central contact portion 7a is equal to a position in height h2 of the circumferential contact portion 9a. During testing, the semiconductor package 100 is mounted in a state where the bottom surface 100a of the semiconductor package 100 comes in contact with the central contact portion 7a and the circumferential contact portion 9a.

Note that the position in height h1 of the central contact portion 7a is not limited to exactly the same as the position in height h2 of the circumferential contact portion 9a. The position in height h2 of the circumferential contact portion 9a may be lower than the position in height h1 of the central contact portion 7a. For example, the position in height h2 of the circumferential contact portion 9a is preferably set to be 50% or more of the height dimension of the central contact portion 7a (50% or more of a depth dimension of the insertion hole 7b).

In a lower part of the pedestal 5, a base 5a is provided. In the base 5a, a plurality of through holes 5b is formed to penetrate the pedestal 5 in a thickness direction thereof (in the z direction). The through holes 5b are formed at positions corresponding to respective solder balls 101 of the semiconductor package 100. Thus, the through holes 5b are communicated and preferably have common axes with respective insertion holes 7b formed in the central pedestal 7. However, through holes 5b are not formed in the circumferential pedestal 9.

In the through holes 5b, contact probes (not shown) are placed. The contact probes are used during testing to electrically connect the solder balls 101 of the semiconductor package 100 to the test board provided below the pedestal 5. Upper ends of the contact probes electrically come in contact with the solder balls 101 of the semiconductor package 100 to test the semiconductor package 100.

Between the central pedestal 7 and the circumferential pedestal 9, the space S1 is formed. More specifically, the space S1 is formed to surround four sides of the central pedestal 7, thereby separating the central pedestal 7 from the circumferential pedestal 9.

The space S1 is in a counterbore shape dented downward from the central contact portion 7a and the circumferential contact portion 9a (dented in the thickness direction of the pedestal 5; that is, in the z direction), and the space S1 has an opening upward. Below the space S1, an upper surface 5c of the base 5a of the pedestal 5 is positioned. Therefore, the through holes 5b formed in the base 5a are also communicated with the space S1.

An opening width w1 of the space S1 (a dimension of the space S1 in the x direction), which is a distance between the side portion of the central pedestal 7 and the side portion of the circumferential pedestal 9 facing each other, is set to be larger than the diameter of the insertion hole 7b; that is, larger than a width of two or more, preferably three or more adjacent insertion holes 7b. In the embodiment shown in FIG. 4, the opening width w1 of the space S1 has a dimension larger than parallelly-arranged four through holes 5b (larger than four insertion holes 7b).

A width dimension w2 of the circumferential contact portion 9a toward the central pedestal 7 (a dimension in the x direction in FIG. 4) is smaller than a width dimension w3 (see FIG. 2) between the solder ball 101 arranged closest to a circumferential side of the semiconductor package 100 and the circumferential side of the bottom surface 100a of the semiconductor package 100. Therefore, the circumferential contact portion 9a only comes in contact with a circumference portion of the semiconductor package 100 where no solder balls 101 are arranged.

As shown in FIG. 1, on a lateral side of the pedestal 5, a latch (a pressing piece) 10 is provided. Another latch 10 is provided at an opposed position across the pedestal 5. Thus, two latches 10 are provided in the x direction across the pedestal 5.

The latches 10 abut on a top surface 100b (see FIG. 2) of the semiconductor package 100 to press the semiconductor package 100 against the pedestal 5. The latches 10 are driven by a drive mechanism (not shown). The drive timing by the drive mechanism may or may not synchronize both latches 10.

Figure 5A:
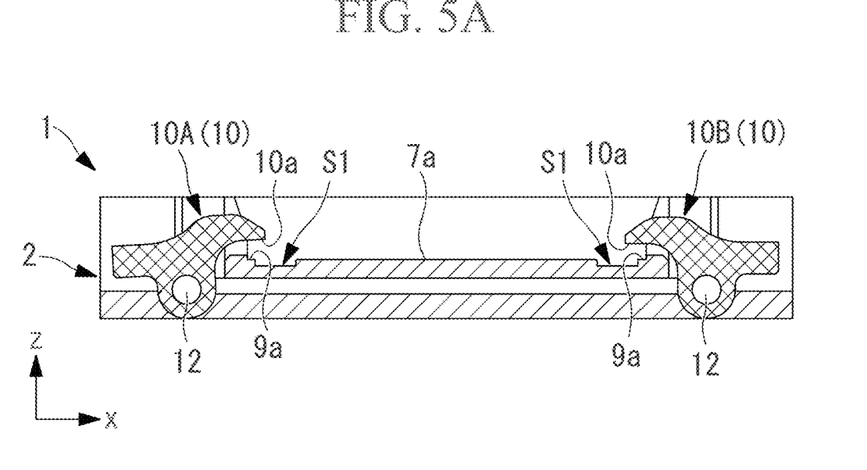
FIG. 5A is a lateral sectional view illustrating a main part of the test socket with latches closed.

FIG. 5A shows a pair of laches 10A and 10B. In FIG. 5A, a first latch (a first pressing piece) 10A is positioned on the left side in an x direction, and a second latch (a second pressing piece) 10B is positioned on the right side in the x direction. The latches 10A and 10B are just arranged symmetrically, having the same shape. Thus, the latches 10A and 10B do not have any differences in configuration, but for convenience of explanation, the individual reference signs may be used.

Figure 5B:
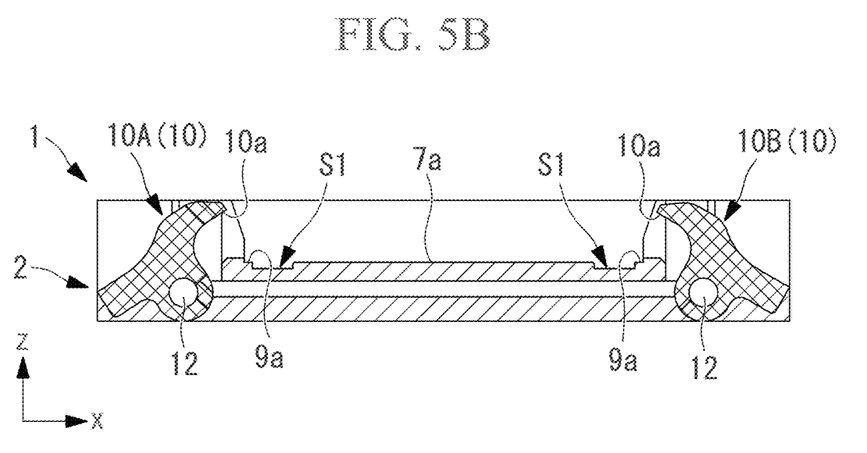
FIG. 5B is a lateral sectional view illustrating the main part of the test socket with the latches opened.

The latches 10A and 10B are rotatably fixed by a rotating axis 12 to the body 2 of the socket 1. FIG. 5A shows a state where the latches 10A and 10B are rotated downward and closed. FIG. 5B shows a state where the latches 10A and 10B are rotated upward and opened.

Figure 5C:
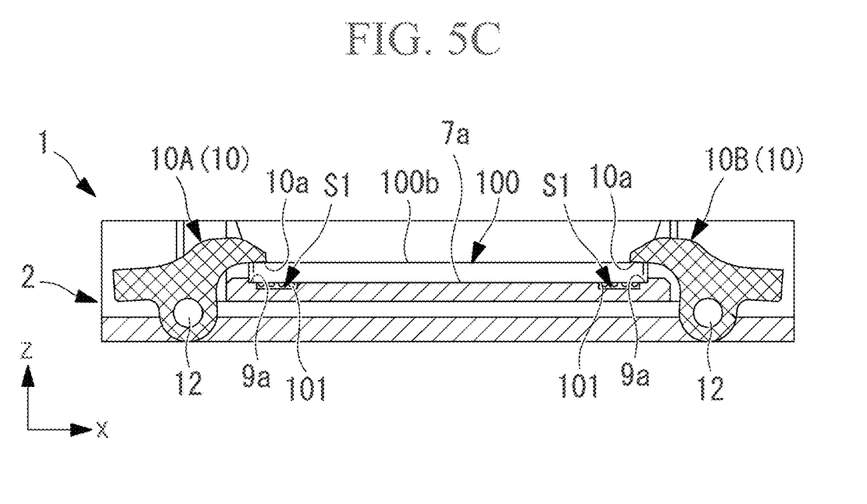
FIG. 5C is a lateral sectional view illustrating the main part of the test socket with the latches closed to press the semiconductor package.

As shown in FIG. 5C, when the latches 10A and 10B are closed, tips 10a of the latches 10A and 10B press the top surface 100b of the semiconductor package 100. In this state shown in FIG. 5C, the semiconductor package 100 is tested. As seen from FIG. 5C, a center portion of the semiconductor package 100 is mounted on the central contact portion 7a, and the circumference portion of the semiconductor package 100 is mounted on the circumferential contact portion 9a.

Figure 6A:
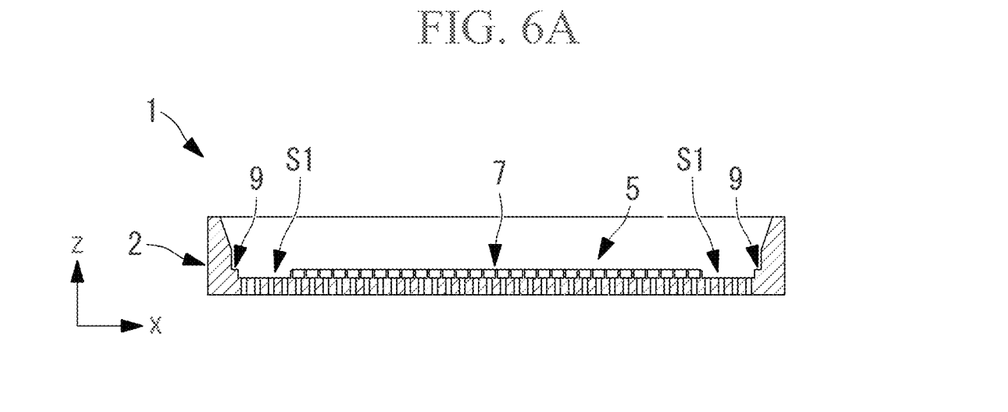
FIG. 6A is a lateral sectional view illustrating a state where the semiconductor package is not yet mounted on the test socket.
Figure 6B:
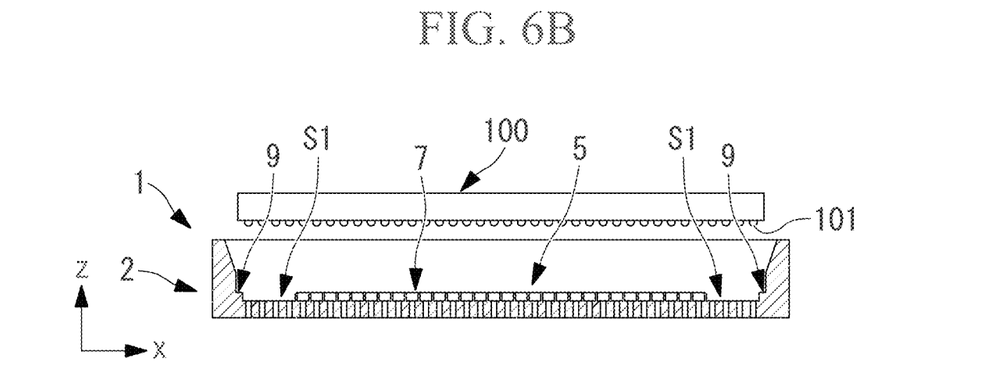
FIG. 6B is a lateral sectional view illustrating a state where the semiconductor package is dropped onto the test socket.
Figure 6C:
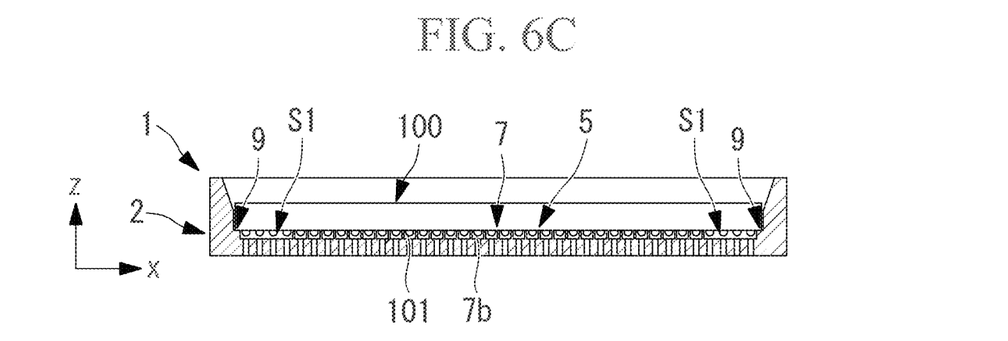
FIG. 6C is a lateral sectional view illustrating a state where the semiconductor package is mounted on the test socket.

FIGS. 6A to 6C show a process of mounting the semiconductor package 100 on the socket 1. As shown in FIG. 6A, nothing is mounted on the pedestal 5 before the semiconductor package 100 is mounted. Then, as shown in FIG. 6B, the semiconductor package 100, which is gripped by a grip mechanism such as a robot hand (not shown), is dropped down from a predetermined height position to the pedestal 5. Then, as shown in FIG. 6C, the solder balls 101 are guided to corresponding insertion holes 7b, so that the dropped semiconductor package 100 is seated on the pedestal 5.

The above-mentioned advantageous effects are described below with reference to reference examples.

Figure 7:
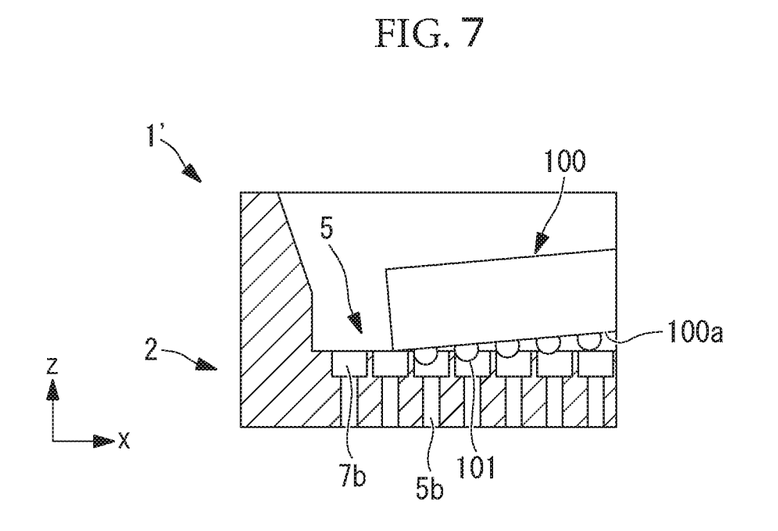
FIG. 7 is a partially enlarged longitudinal sectional view illustrating a test socket of a reference example 1.

FIG. 7 illustrates a socket 1' shown as a reference example 1. FIG. 7 corresponds to FIG. 4 and is a partially enlarged longitudinal sectional view illustrating the socket 1' of the reference example 1. The socket 1' does not include the space S1 of the socket 1 according to the present embodiment. Thus, the socket 1' includes insertion holes 7b and through holes 5b corresponding to all solder balls 101 over the whole of the pedestal 5. Consequently, when the semiconductor package 100 is dropped from the predetermined height position as shown in FIG. 6B, the semiconductor package 100 may fall non-parallelly to the pedestal 5 or may bounce on the pedestal 5 due to some failure, so that the semiconductor package 100 cannot be properly seated. For example, as shown in FIG. 7, one side (the left side) of the bottom surface 100a of the semiconductor package 100 may earlier come in partial contact with the pedestal 5. If the bottom surface 100a of the semiconductor package 100 partially comes in contact with the pedestal 5, solder balls 101 arranged in a vicinity of a partially contact region may be inserted into insertion holes 7b different from properly corresponding insertion holes 7b. In FIG. 7, the solder balls 101 are set in a state of being shifted to the right side by a width corresponding to two insertion holes 7b. This may cause a test failure and stop a production line, so that time, cost, and productivity can be significantly affected.

Figure 8:
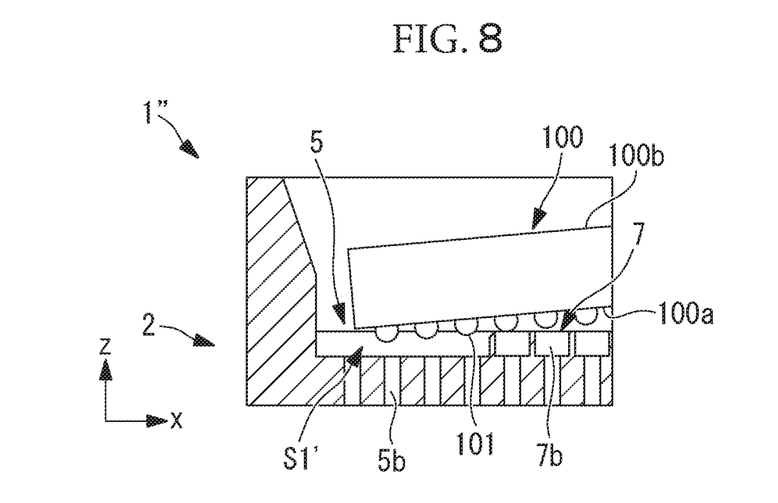
FIG. 8 is a partially enlarged longitudinal sectional view illustrating a test socket of a reference example 2.

To solve the above problem, a socket 1" shown as a reference example 2 in FIG. 8 can be considered. The socket 1" has a space S1' as in the socket 1 according to the present embodiment. However, the socket 1" does not include circumferential pedestal 9 according to the present embodiment. Thus, a counterbore shape of the space S1' extends to the end of the pedestal 5. As such, the space S1' extends to the end of the pedestal 5 and any portion is not provided to support the circumference portion of the semiconductor package 100. Consequently, as shown in FIG. 8, the left end of the semiconductor package 100 falls in the space S1' to get into a state of seesaw (bounce) with the upper left end of the central pedestal 7 serving as a fulcrum. For example, if the first latch 10A shown in FIG. 5A abuts on the top surface 100b of the semiconductor package 100 earlier than the second latch 10B shown in FIG. 5A, then the semiconductor package 100 gets into the state of seesaw as shown in FIG. 8. In such a state of seesaw, the right end of the semiconductor package 100 greatly bounces upward. As a result, the tip 10a of the second latch 10B cannot lock the top surface 100b of the semiconductor package 100.

Figure 9:
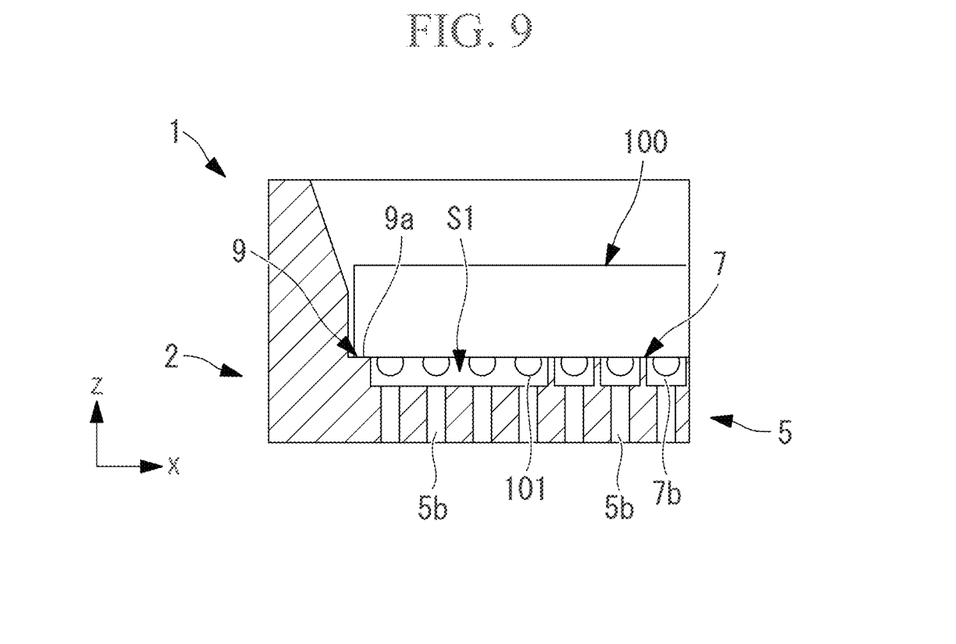
FIG. 9 is a partially enlarged longitudinal sectional view illustrating the test socket according to the first embodiment.

To address the above, the socket 1 according to the present embodiment includes the circumferential pedestal 9. Since the circumferential pedestal 9 is provided as shown in FIG. 9, the circumferential contact portion 9a earlier abuts on the circumference of the semiconductor package 100, so that the semiconductor package 100 can be properly seated. Thus, the bottom surface 100a of the semiconductor package 100 can be held stably by the circumferential contact portion 9a.

Second Embodiment

A second embodiment of the present invention is described below. According to the present embodiment, a circumferential pedestal has a shape different from the circumferential pedestal 9. In the following, differences from the first embodiment are explained, and no explanations are given to the same configurations as the first embodiment.

Figure 10:
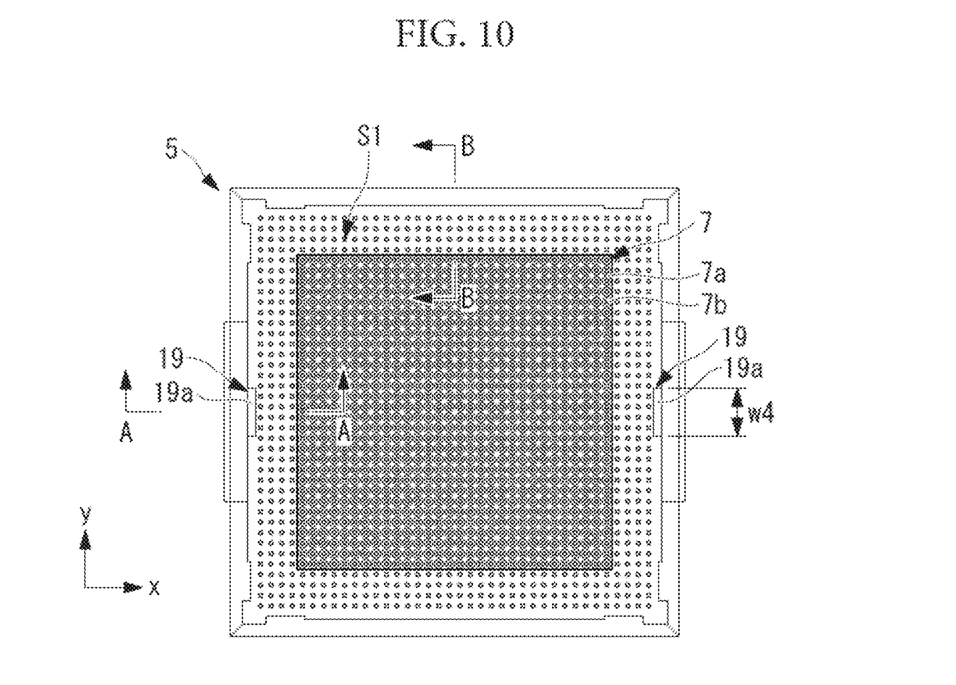
FIG. 10 is a plan view illustrating a main part of a test socket according to a second embodiment of the present invention.
Figure 11:
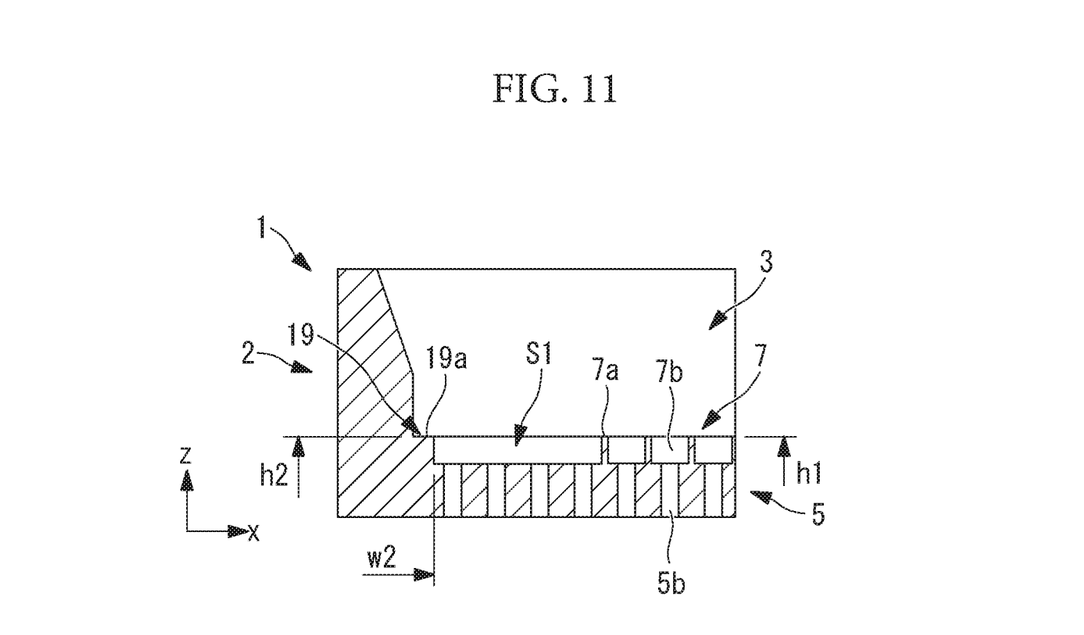
FIG. 11 is a sectional view taken along line A-A of FIG. 10.

The circumferential pedestal 9 according to the first embodiment has a rectangle frame shape so as to surround four sides of the central pedestal 7. On the other hand, a circumferential pedestal 19 according to the present embodiment is provided partially. More specifically, as shown in FIG. 10, the circumferential pedestal 19 is provided only at positions corresponding to the first latch 10A (see FIG. 5A) and the second latch 10B (see FIG. 5A). In other words, the circumferential pedestal 19 is provided at substantially center positions of both sides (right and left sides in FIG. 10) extending in the y direction and being separated by the space S1 from both sides of the central pedestal 7 in the x direction. The circumferential pedestal 19 includes a circumferential contact portion 19a provided on an upper surface thereof. On the circumferential contact portion 19a, the circumference of the semiconductor package 100 is mounted. FIG. 11 is a sectional view taken along line A-A of FIG. 10. As shown in FIG. 11, the circumferential pedestal 19 is provided on the lateral side of the central pedestal 7 with the space S1 provided therebetween.

A width dimension w4 (see FIG. 10), which is a dimension of the circumferential contact portion 19a in the y direction, is equal to or smaller than a width dimension of the first latch 10A and the second latch 10B in the same direction. Note that the width dimension w4 of the circumferential contact portion 19a may be larger than the width dimension of the first latch 10A and the second latch 10B, but preferably, the width dimension w4 is smaller than a dimension of the central pedestal 7 in the y direction.

As shown in FIG. 11, a position in height h1 of the central contact portion 7a is equal to a position in height h2 of the circumferential contact portion 19a, as with the first embodiment. However, the position in height h2 of the circumferential contact portion 19a may be lower than the position in height h1 of the central contact portion 7a, as with the first embodiment.

A width dimension w2 of the circumferential contact portion 19a toward the central pedestal 7 (a dimension in the x direction in FIG. 11) is the same as the dimension in the first embodiment. Specifically, the width dimension w2 is smaller than a width dimension w3 (see FIG. 2) between the solder ball 101 arranged closest to the circumferential side of the semiconductor package 100 and the circumferential side of the bottom surface 100a of the semiconductor package 100.

Figure 12:
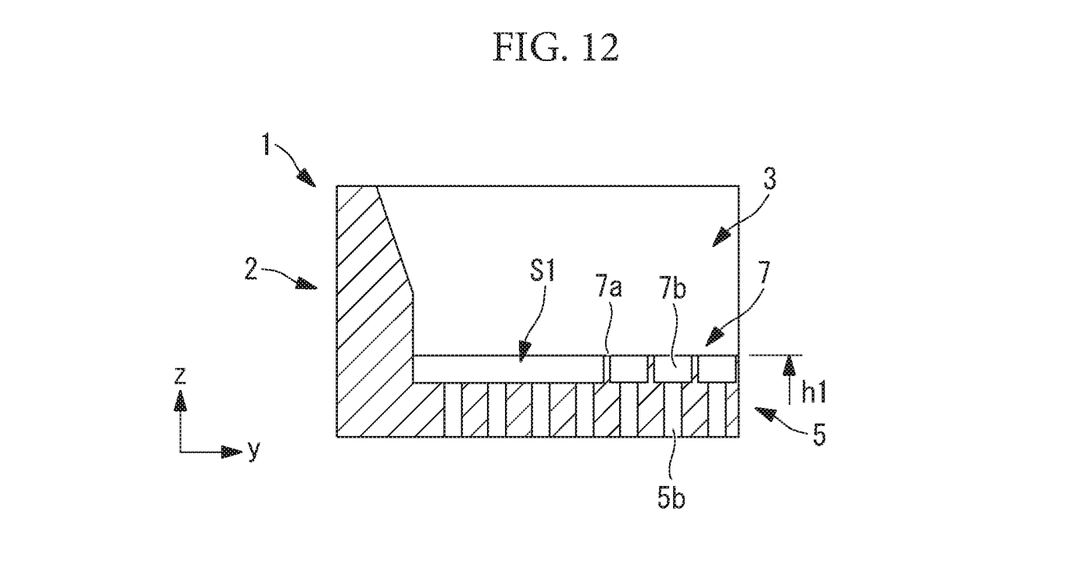
FIG. 12 is a sectional view taken along line B-B of FIG. 10.

However, the circumferential pedestal 19 is not provided on sides (upper and lower sides in FIG. 10) extending in the x direction and being separated by the space S1 from both sides of the central pedestal 7 in the y direction. As shown in FIG. 12 which is a sectional view taken along line B-B of FIG. 10, only the space S1 is provided on a lateral side of the central pedestal 7, and the circumferential pedestal 9 is not provided.

An advantageous effect according to the present embodiment is described below.

Figure 13:
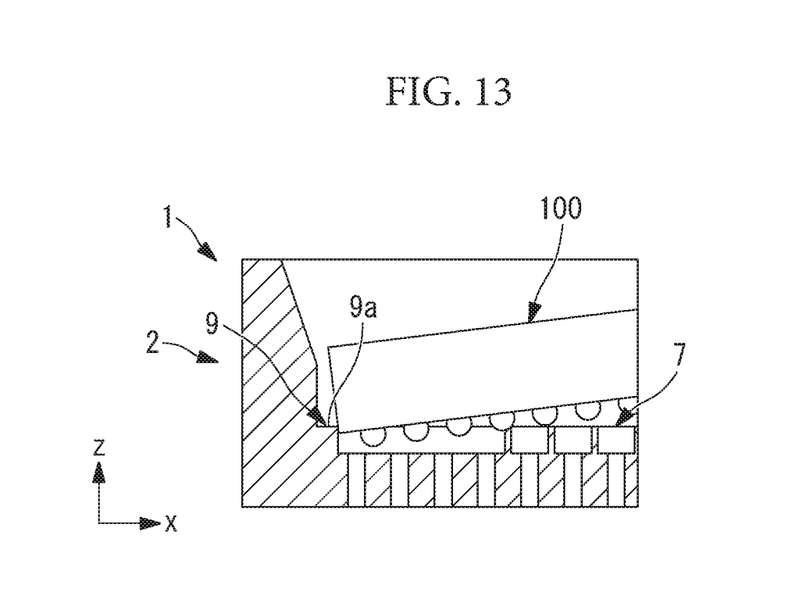
FIG. 13 is a partially enlarged lateral sectional view illustrating a state where the semiconductor package is caught at a corner of a circumferential contact portion.

The circumferential pedestal 9 according to the first embodiment is in a frame shape having four sides. Consequently, one side of the semiconductor package 100 may be caught somewhere at the circumferential contact portion 9a, so that the semiconductor package can be improperly seated. Specifically, as shown in FIG. 13, the left end of the semiconductor package 100 may be caught at a corner of the circumferential contact portion 9a to get into a state of seesaw (bounce) with the upper left end of the central pedestal 7 serving as a fulcrum.

Figure 14:
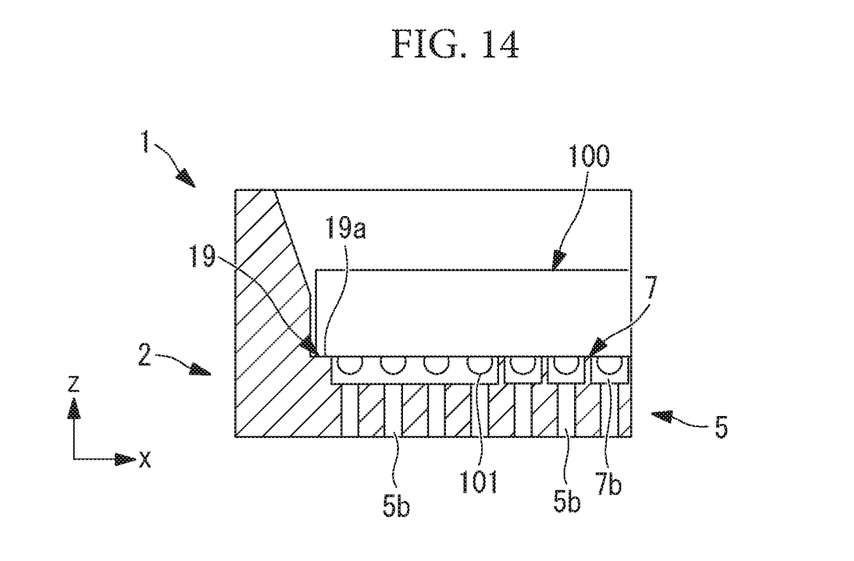
FIG. 14 is a partially enlarged lateral sectional view illustrating a state where the semiconductor package is seated on the test socket according to the second embodiment.

To address the above, the circumferential contact portion 19a according to the present embodiment is provided only at the positions corresponding to the first latch 10A and the second latch 10B. Consequently, the semiconductor package 100 can be properly seated as shown in FIG. 14.

MODIFIED EXAMPLE

Figure 15:
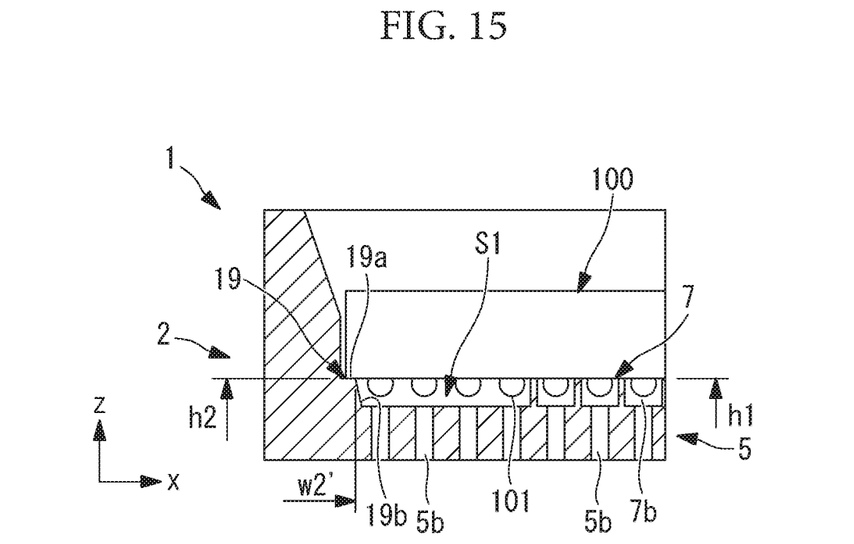
FIG. 15 is a partially enlarged lateral sectional view illustrating a test socket as a modified example.

The present embodiment can be modified as shown in FIG. 15.

The circumferential pedestal 19 includes a tapered surface 19b. An upper end of the tapered 19b is connected to the circumferential contact portion 19a. The tapered surface 19b is provided to be inclined downward in the z direction from the circumferential contact portion 19a so as to be closer to the central pedestal 7. Accordingly, a width dimension w2' of the circumferential contact portion 19a projecting toward the space S1 can be made smaller. This can prevent the semiconductor package 100 from being caught at the circumferential contact portion 19a as much as possible.

Note that the tapered 19b may be provided on the circumferential pedestal 9 according to the first embodiment.

REFERENCE SIGNS LIST

1: Test socket
2: Body
2a: Plate portion
2b: Wall portion
3: Recess
5: Pedestal
5a: Base
5b: Through hole
5c: Upper surface
7: Central pedestal
7a: Central contact portion
7b: Insertion hole
9: Circumferential pedestal
9a: Circumferential contact portion
10: Latch (Pressing piece)
10a: Tip
10A: First latch
10B: Second latch
19: Circumferential pedestal
19a: Circumferential contact portion
19b: Tapered surface
100: Semiconductor package
100a: Bottom surface
100b: Top surface
101: Solder ball (Projection terminal)
h1: Position in height (of central contact portion)
h2: Position in height (of circumferential contact portion)
S1: Space
w1: Opening width (of space)
w2, w2': Width dimension (of circumferential contact portion in x direction)
w3: Width dimension (of circumference of semiconductor package)
w4: Width dimension (of circumferential contact portion in y direction)

The invention claimed is:

1. A test socket comprising:
a pedestal on which a bottom surface of a semiconductor package to be tested is mounted during testing, wherein the pedestal comprises:
a central pedestal including a central contact portion coming in contact with a central region of the bottom surface of the semiconductor package from below, and a plurality of insertion holes formed to correspond to a plurality of projection terminals projecting from the bottom surface of the semiconductor package, so as to allow the projection terminals to be inserted into respective insertion holes; and
a circumferential pedestal separated from a periphery of the central pedestal by a space having an opening width larger than a diameter of the respective insertion holes, and including a circumferential contact portion coming in contact with a circumference of the bottom surface of the semiconductor package from below.

2. The test socket according to claim 1, wherein the circumferential contact portion is provided at a position corresponding to a whole of the circumference of the bottom surface of the semiconductor package.

3. The test socket according to claim 1, wherein the circumferential contact portion has a width dimension so as to come in contact with a further circumferential side of the bottom surface of the semiconductor package than the projection terminal arranged closest to the circumferential side of the semiconductor package.

4. The test socket according to claim 1, wherein a position in height of the circumferential contact portion is equal to or lower than a position in height of the central contact portion.

5. The test socket according to claim 1, further comprising:
- a first pressing piece positioned on one end side of the pedestal and abutting on a top surface of the semiconductor package to press the semiconductor package against the pedestal; and
- a second pressing piece positioned on another end side of the pedestal facing the one end side of the pedestal and abutting on the top surface of the semiconductor package to press the semiconductor package against the pedestal.

6. The test socket according to claim 5, wherein the circumferential contact portion is provided only at positions corresponding to the first pressing piece and the second pressing piece.

7. The test socket according to claim 6, wherein the circumferential pedestal includes a tapered surface inclined downward from the circumferential contact portion so as to be closer to the central pedestal.

* * * * *